(12) United States Patent
Chang (10) Patent No.: US 9,747,989 B1
(45) Date of Patent: Aug. 29, 2017

(54) MEMORY DEVICE AND CONTROL METHOD THEREOF

(71) Applicant: MACRONIX INTERNATIONAL CO., LTD., Hsinchu (TW)

(72) Inventor: Kuo-Pin Chang, Miaoli County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/410,815

(22) Filed: Jan. 20, 2017

(30) Foreign Application Priority Data

Dec. 8, 2016 (TW) .............................. 105140724 A (51) Int. Cl.
G11C 16/04 (2006.01)
G11C 16/16 (2006.01)
G11C 16/08 (2006.01)

(52) U.S. Cl.
CPC .......... *G11C 16/16* (2013.01); *G11C 16/0483* (2013.01); *G11C 16/08* (2013.01)

(58) Field of Classification Search
USPC ............. 365/185.29, 185.11, 185.17, 185.18
See application file for complete search history.

(56) References Cited

U.S. PATENT DOCUMENTS

2005/0226048 A1* 10/2005 Lee .................. G11C 16/24 365/185.17
2012/0287723 A1* 11/2012 Passerini ............... G11C 16/06 365/185.25

* cited by examiner

*Primary Examiner* — Vu Le
(74) *Attorney, Agent, or Firm* — McClure, Qualey & Rodack, LLP (57) ABSTRACT

A memory device and a control method of the memory device are provided. The memory device includes a decoding circuit, Q switching circuits and Q blocks. The decoding circuit generates Q select signals. A k-th select signal of the Q select signals has a first select voltage. The other (Q–1) select signals have a second select voltage. The Q switching circuits receive an erase voltage, and generate Q common source line signals according to the Q select signals. A k-th common source line signal of the Q common source line signals generated by a k-th switching circuit of the Q switching circuits has the erase voltage. The Q blocks receive the Q common source line signals, respectively. A k-th block of the Q blocks is erased according to the k-th common source line signal.

20 Claims, 8 Drawing Sheets

MEMORY DEVICE AND CONTROL METHOD THEREOF

This application claims the benefit of Taiwan application Serial No. 105140724, filed Dec. 8, 2016, the subject matter of which is incorporated herein by reference.

FIELD OF THE DISCLOSURE

The present disclosure relates to a memory device and a control method, and more particularly to a memory device and a control method for erasing the memory device.

BACKGROUND OF THE DISCLOSURE

A flash memory is one of the popular non-volatile memories. Generally, flash memories can be classified into two types, that is, NOR flash memories and NAND flash memories. Since the erase speed of the NAND flash memory is faster and the area of each storage unit is smaller, the applications of the NAND flash memory are more extensive.

A NAND flash memory chip usually consists of plural blocks. Each block includes plural transistors (or cells) that are connected with each other in series. While a read operation, a write operation or an erase operation is performed, a memory controller provides corresponding voltages to the gate terminals, source terminals and drain terminals of the cells through a row decoder.

As known, the flash memory can only be erased in blocks units. Moreover, the NAND flash memory usually has global common source line (hereinafter, GCSL) architecture. For erasing a selected block, the common source line (hereinafter, CSL) corresponding to the selected block is connected to a high voltage level, and the CSLs corresponding to the unselected blocks are also connected with the high voltage level. In this context, the term GCSL denotes a global common source line or a global common source line signal, and the term CSL denotes a common source line or a common source line signal.

Figure 1:
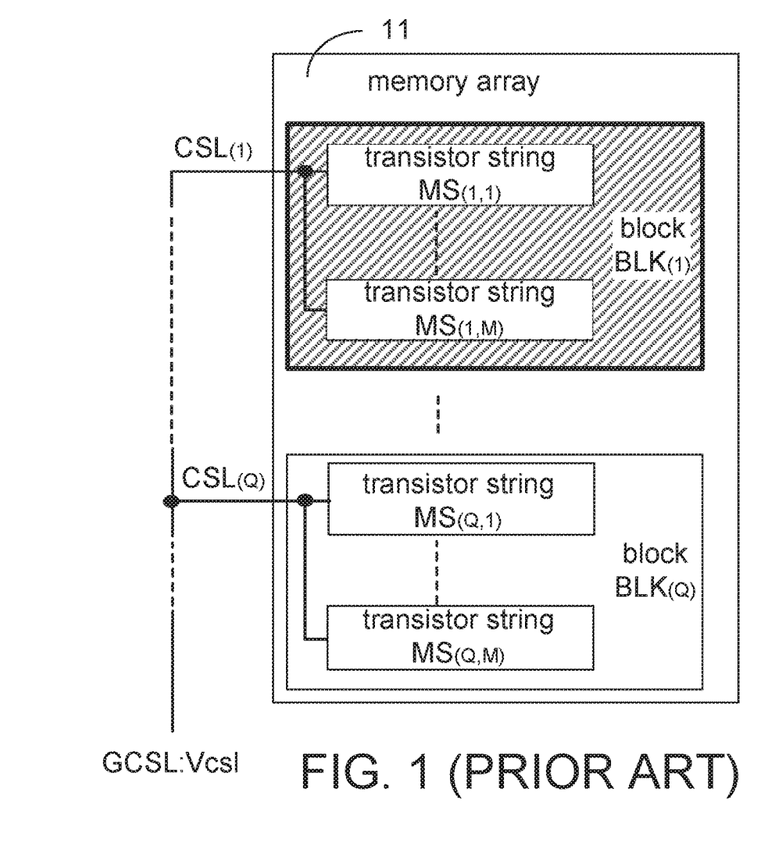
FIG. 1 (prior art) schematically illustrates a NAND flash memory with a GCSL architecture.

FIG. 1 schematically illustrates a NAND flash memory with a GCSL architecture. A memory array 11 of the NAND flash memory includes Q blocks $BLK_{(q)}$, where q=1~Q. Each block $BLK_{(q)}$ includes M transistor strings MS(q,1)~MS(q,M). For example, the transistor string MS(1, 1) denotes the first transistor string in the first block $BLK_{(1)}$, the transistor string MS(1,M) denotes the M-th transistor string in the first block $BLK_{(1)}$, the transistor string MS(Q,1) denotes the first transistor string in the Q-th block $BLK_{(Q)}$, and the transistor string MS(Q,M) denotes the M-th transistor string in the Q-th block $BLK_{(Q)}$. The rest may be deduced by analogy.

The blocks $BLK_{(1)}$~$BLK_{(Q)}$ of the NAND flash memory are electrically connected with a global common source line GCSL through the corresponding common source lines $CSL_{(1)}$~$CSL_{(Q)}$, respectively. In FIG. 1, the block $BLK_{(k)}$ marked by oblique lines denotes a selected block to be erased. As shown in FIG. 1, the block $BLK_{(1)}$ is the selected block.

For erasing the block $BLK_{(1)}$, an erase voltage Vcsl with a high voltage level (for example, a 20V-program pulse) is provided to the global common source line GCSL. In other words, the erase voltage Vcsl in the high voltage level state is provided to all of the common source lines $CSL_{(1)}$~$CSL_{(Q)}$. Since the block $BLK_{(1)}$ is the selected block, the cells corresponding to the transistor strings $MS_{(1,1)}$~$MS_{(1,M)}$ are erased according to the erase voltage Vcsl from the common source line $CSL_{(1)}$. However, the transistor strings of the unselected block, for example, the transistor strings $MS_{(Q,1)}$~$MS_{(Q,M)}$ of the block $BLK_{(Q)}$, are possibly suffered from unexpected influenced by the erase voltage Vcsl from the common source line $CSL_{(Q)}$.

Since the block $BLK_{(Q)}$ is the unselected block, the erase voltage Vcsl may result in a gate-induced-drain-leakage (hereinafter, GIDL) phenomenon on the terminals of the transistor strings $MS_{(Q,1)}$~$MS_{(Q,M)}$. The GIDL phenomenon may adversely affect the programming results of the cells and further result in erase interference. In addition to the region between the gate terminal and the drain terminal, the GIDL phenomenon possibly occurs between the gate terminal and the source terminal. As the length of the channel region and the thickness of the oxide layer are continuously decreased, the influence of the GIDL phenomenon on the NAND flash memory becomes more obvious.

SUMMARY OF THE DISCLOSURE

The present disclosure provides a memory device and a control method thereof. During an erase operation of the memory device, the common source line signals provided to the blocks of the memory device are independent from each other. Consequently, the GIDL phenomenon and the erase interference can be effectively avoided.

An embodiment of the present disclosure provides a memory device that performs an erase operation. The memory device includes a decoding circuit, a switching module and a memory array. The decoding circuit generates Q select signals. A k-th select signal of the Q select signals has a first select voltage. The other (Q−1) select signals have a second select voltage. The switching module is electrically connected with the decoder, and receives an erase voltage. The first select voltage is higher than the erase voltage. The erase voltage is higher than the second select voltage. The switching module includes Q switching circuits. The Q switching circuits receives the erase voltage and generates Q common source line signals according to the Q select signals. A k-th common source line signal of the Q common source line signals generated by a k-th switching circuit of the Q switching circuits has the erase voltage. The memory array is electrically connected with the Q switching circuits. The memory array includes Q blocks. The Q blocks receive the Q common source line signals, respectively. A k-th block of the Q blocks is erased according to the k-th common source line signal.

Another embodiment of the present disclosure provides a control method for erasing a memory device. The memory device includes a decoding circuit, Q switching circuits and Q blocks. The control method includes the following steps. Firstly, the decoding circuit generates Q select signals. A k-th select signal of the Q select signals has a first select voltage. The other (Q−1) select signals have a second select voltage. Then, the Q switching circuits receives an erase voltage. The first select voltage is higher than the erase voltage, and the erase voltage is higher than the second select voltage. The Q switching circuits generates Q common source line signals according to the Q select signals. A k-th common source line signal of the Q common source line signals generated by a k-th switching circuit of the Q switching circuits has the erase voltage. The Q blocks receive the Q common source line signals, respectively. Then, a k-th block of the Q blocks is erased according to the k-th common source line signal.

Numerous objects, features and advantages of the present disclosure will be readily apparent upon a reading of the following detailed description of embodiments of the present disclosure when taken in conjunction with the accompanying drawings. However, the drawings employed herein are for the purpose of descriptions and should not be regarded as limiting.

BRIEF DESCRIPTION OF THE DRAWINGS

The above objects and advantages of the present disclosure will become more readily apparent to those ordinarily skilled in the art after reviewing the following detailed description and accompanying drawings, in which.

DETAILED DESCRIPTION OF PREFERRED EMBODIMENTS

The present disclosure provides a memory device and a control method thereof. In accordance with the present disclosure, the memory device is equipped with a common source line decoder (CSL decoder) to isolate the common source line signals of all blocks from each other. The CSL decoder is employed to perform an erase operation on a memory array.

Figure 2A:
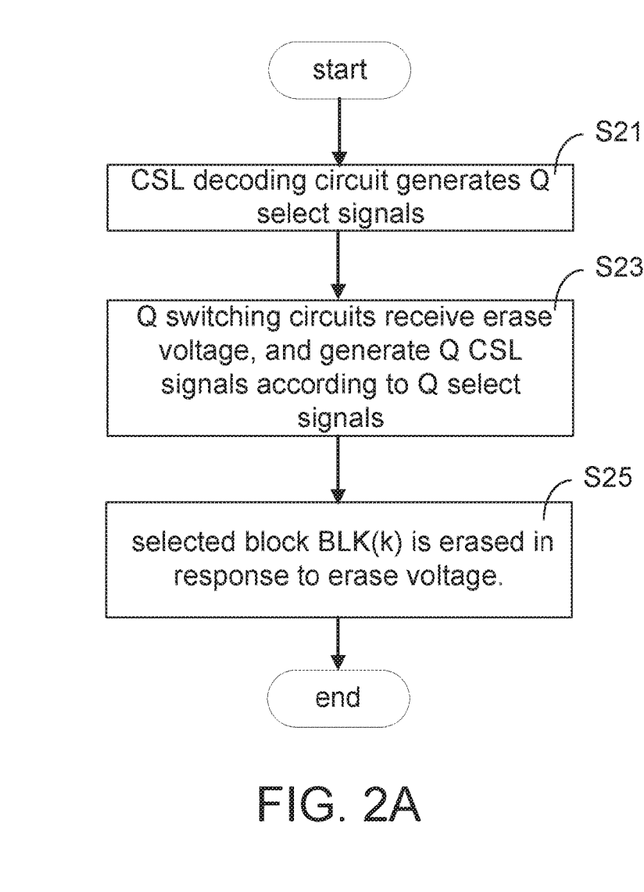
FIG. 2A is a flowchart of a control method for erasing a memory device according to an embodiment of the present disclosure.

FIG. 2A is a flowchart of a control method for erasing a memory device according to an embodiment of the present disclosure. A row decoder of the memory device includes a CSL decoder. The CSL decoder includes a CSL decoding circuit and Q switching circuits. Firstly, the CSL decoding circuit generates Q select signals $DECcsl_{(1)} \sim DECcsl_{(Q)}$ to the Q switching circuits (Step S21). The Q switching circuits receive an erase voltage Vcsl, and generate Q CSL signals $CSL_{(1)} \sim CSL_{(Q)}$ according to the Q select signals $DECcsl_{(1)} \sim DECcsl_{(Q)}$ (Step S23). The common source line signals $CSL_{(k)}$ provided to the k-th block $BLK_{(k)}$ (that is, a selected block) is equal to the erase voltage Vcsl (Step S25). On the other hand, the common source line signals $CSL_{(1)} \sim CLK_{(k-1)}$ and $CSL_{(k+1)} \sim CSL_{(Q)}$ provided to the unselected blocks $BLK_{(1)} \sim BLK_{(k-1)}$ and $BLK_{(k+1)} \sim BLK_{(Q)}$ are equal to an un-erase voltage (for example, 0V) or in a floating state.

In accordance with a feature of the present disclosure, only the common source line signals $CSL_{(k)}$ provided to selected block $BLK_{(k)}$ is changed with the voltage of the GCSL signal. Since the common source line signals $CSL_{(1)} \sim CLK_{(k-1)}$ and $CSL_{(k+1)} \sim CSL_{(Q)}$ provided to the unselected blocks $BLK_{(1)} \sim BLK_{(k-1)}$ and $BLK_{(k+1)} \sim BLK_{(Q)}$ are not influenced by the voltage change of the GCSL signal, the GIDL phenomenon and the erase interference can be effectively avoided.

Figure 2B:
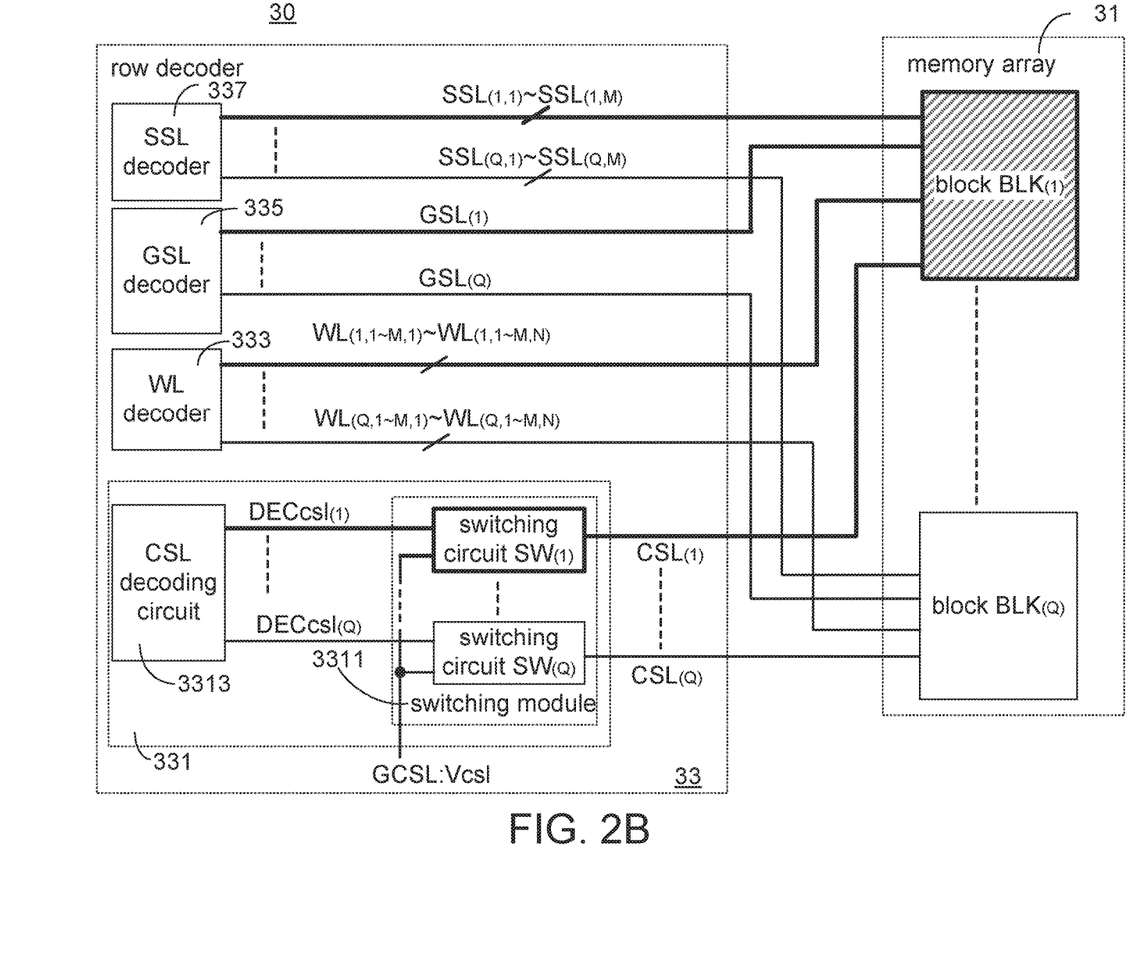
FIG. 2B is a schematic circuit diagram illustrating a memory device according to an embodiment of the present disclosure.

FIG. 2B is a schematic circuit diagram illustrating a memory device according to an embodiment of the present disclosure. As shown in FIG. 2B, the memory device 30 includes a row decoder 33 and a memory array 31. The memory array 31 includes Q blocks $BLK_{(1)} \sim BLK_{(Q)}$. The row decoder 33 includes a string select line (hereinafter, SSL) decoder 337, a ground select line (hereinafter, GSL) decoder 335, a word line (hereinafter, WL) decoder 333 and a CSL decoder 331. The CSL decoder 331 includes a CSL decoding circuit 3313 and a switching module 3311. The switching module 3311 includes Q switching circuits $SW_{(1)} \sim SW_{(Q)}$.

After the row decoder 33 receives a block select signal from a memory controller (not shown), the row decoder 33 realizes that the block $BLK_{(k)}$ is a selected block to be erased. Then, the row decoder 33 issues different types of decoding signals to the selected block $BLK_{(k)}$ and the unselected blocks. For example, the SSL decoder 337 issues string select line signals $SSL_{(1,1)} \sim SSL_{(1,M)}$ to the block $BLK_{(1)}$, and issues string select line signals $SSL_{(Q,1)} \sim SSL_{(Q,M)}$ to the block $BLK_{(Q)}$. Moreover, the GSL decoder 335 issues a ground select signal $GSL_{(1)}$ to the block $BLK_{(1)}$ and issues a ground select signal $GSL_{(Q)}$ to the block $BLK_{(Q)}$. Moreover, the WL decoder 333 issues word line signals $WL_{1,1 \sim M,1} \sim WL_{(1,1 \sim M,N)}$ to the block $BLK_{(1)}$, and issues word line signals $WL_{Q,1 \sim M,1} \sim WL_{(Q,1 \sim M,N)}$ to the block $BLK_{(Q)}$. Moreover, the CSL decoding circuit 3313 of the CSL decoder 311 issues select signals $DECcsl_{(1)} \sim DECcsl_{(Q)}$ to the switching circuits $SW_{(1)} \sim SW_{(Q)}$.

Among these select signals $DECcsl_{(1)} \sim DECcsl_{(Q)}$, the select signal $DECcsl_{(k)}$ corresponding to the selected block BLK(k) has a first select voltage VselH (for example, 25V), and the select signals $DECcsl_{(1)} \sim DECcsl_{(k-1)}$ and $DECcsl_{(k)} \sim DECcsl_{(Q)}$ corresponding to the unselected blocks $BLK_{(1)} \sim BLK_{(k-1)}$ and $BLK_{(k+1)} \sim BLK_{(Q)}$ have a second select voltage VselL (for example, 0V). The first select voltage VselH is higher than the erase voltage Vcsl, and the erase voltage Vcsl is higher than the second select voltage VselL.

In the following embodiments, it is assembled that k=1. That is, the block $BLK_{(1)}$ is the selected block $BLK_{(k)}$. For clarification, the relationships between the block $BLK_{(1)}$ and the corresponding components are indicated as bold lines. In this embodiment, only the block $BLK_{(Q)}$ is shown to indicate the unselected block. The operations of the other unselected blocks $BLK_{(2)} \sim BLK_{(Q)}$ are similar to those of the block $BLK_{(Q)}$, and are not redundantly described herein.

Figure 3:
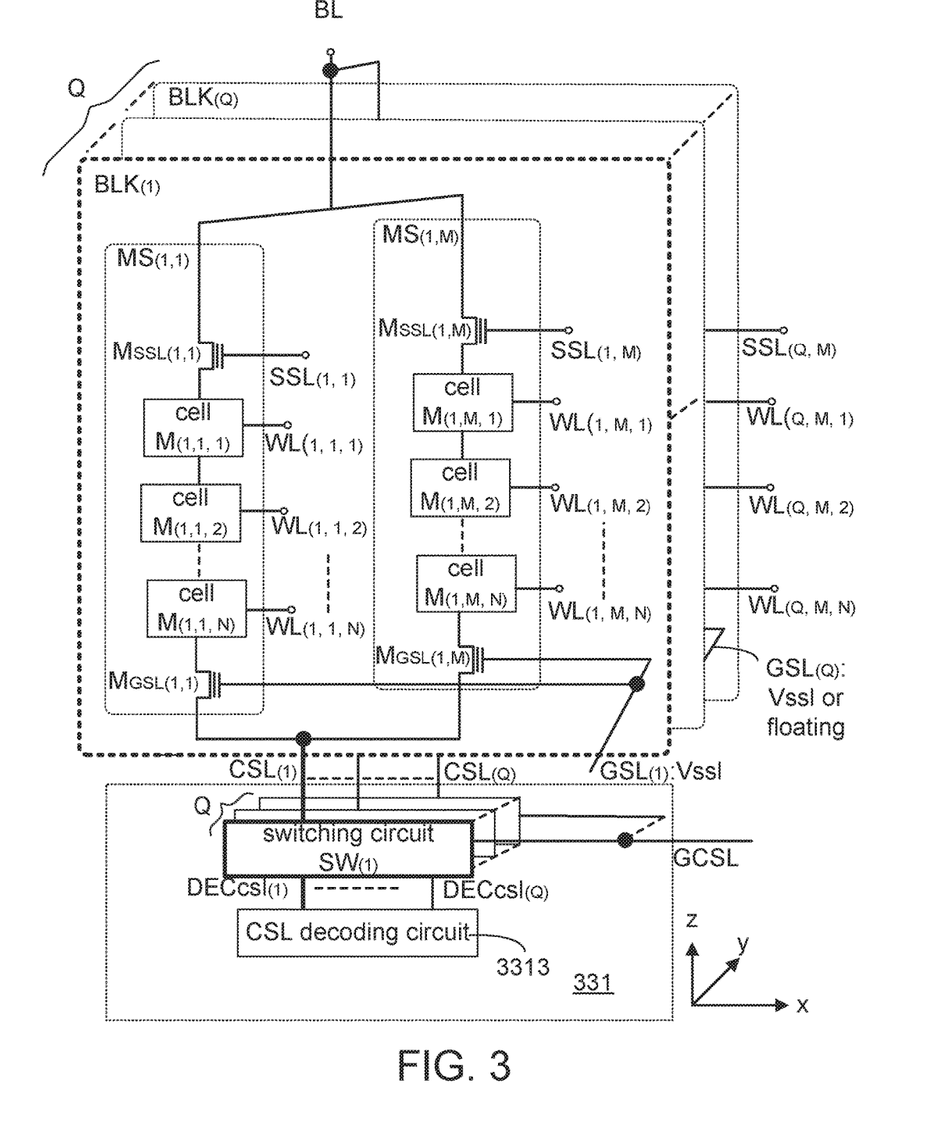
FIG. 3 is a schematic circuit diagram illustrating the cooperation of the CSL decoder and the memory array of the memory device during the erase operation.

FIG. 3 is a schematic circuit diagram illustrating the cooperation of the CSL decoder and the memory array of the memory device during the erase operation. As shown in FIG. 3, the CSL decoding circuit 3313 of the CSL decoder 311 issues the select signals $DECcsl_{(1)} \sim DECcsl_{(Q)}$ to the switching circuits $SW_{(1)} \sim SW_{(Q)}$. Moreover, the Q switching circuits receive the erase voltage Vcsl from the global common source line GCSL. In an embodiment, the erase voltage Vcsl has a high voltage level (for example, 20V). According to the voltage levels of the select signals $DECcsl_{(1)} \sim DECcsl_{(Q)}$, the switching circuits $SW_{(1)} \sim SW_{(Q)}$ generate the common source line signals $CSL_{(1)} \sim CSL_{(Q)}$ to the corresponding blocks $BLK_{(1)} \sim BLK_{(Q)}$. For example, the switching circuit $SW_{(1)}$ receives the select signal $DECcsl_{(1)}$ and the erase voltage Vcsl from the global common source line GCSL. According to the voltage of the select signal $DECcsl_{(1)}$, the erase voltage Vcsl is selectively transmitted to the block $BLK_{(1)}$.

In an embodiment, the memory array includes Q blocks $BLK_{(1)}$~$BLK_{(Q)}$. According to the practical requirements, the blocks $BLK_{(1)}$~$BLK_{(Q)}$ are connected to the same bit line BL or different bit lines. Each of the blocks $BLK_{(1)}$~$BLK_{(Q)}$ includes M transistor strings. Each transistor string includes N cells, a string select line transistor MSSL and a ground select line transistor MGSL.

For example, the block $BLK_{(1)}$ includes M transistor strings $MS_{(1,1)}$~$MS_{(1,M)}$. Each transistor string includes (N+2) transistors, including N transistors of the N cells, the string select line transistor MSSL and the ground select line transistor MGSL. The control terminals of the N transistors of the N cells are connected with the corresponding word lines WL.

From top to bottom, the transistor string MS(1,1) of the block $BLK_{(1)}$ includes the string select line transistor $M_{SSL(1,1)}$, the N cells $M_{(1,1,1)}$, $M_{(1,1,2)}$, ..., $M_{(1,1,N)}$, and the ground select line transistor $M_{GSL(1,1)}$. The control terminal of the cell $M_{(1,1,1)}$ is connected with the word line $WL_{(1,1,1)}$. The control terminal of the cell $M_{(1,1,2)}$ is connected with the word line $WL_{(1,1,2)}$. The rest may be deduced by analogy.

The symbol (x,y,z) used herein indicates the arrangement of each component along different direction. For example, the x-coordinates denote the positions of the blocks $BLK_{(1)}$~$BLK_{(Q)}$, the y-coordinates denote the positions of the transistor strings in the blocks, and z-coordinates denote the positions of cells in the transistor strings. It is noted that the numbers of the x-coordinates, y-coordinates and z-coordinates are not restricted.

Since the memory device of the present disclosure is equipped with the CSL decoder, the common source line signals $CSL_{(1)}$~$CSL_{(Q)}$ are independent from each other. Hereinafter, two examples of the CSL decoder will be described. It is noted that the examples of the CSL decoder are not restricted.

Figure 4:
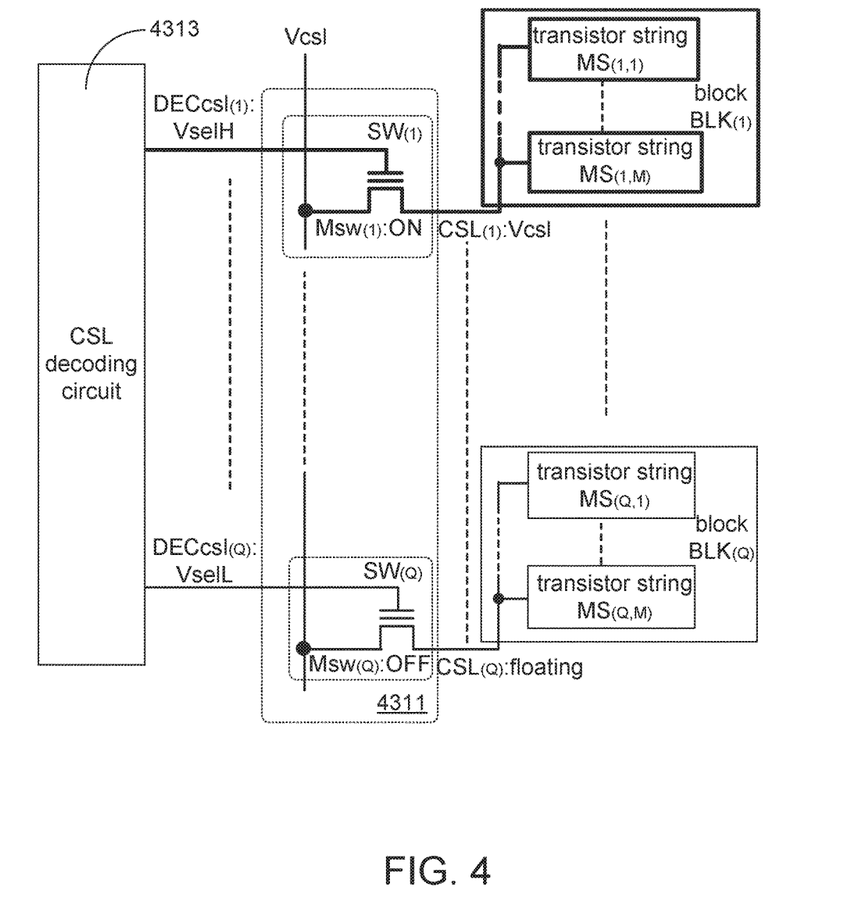
FIG. 4 is an example of a CSL decoder used in the memory device of the present disclosure.

FIG. 4 is an example of a CSL decoder used in the memory device of the present disclosure. As shown in FIG. 4, the CSL decoding circuit 4313 of the CSL decoder issues the select signal $DECcsl_{(1)}$~$DECcsl_{(Q)}$ to the switching module 4311. The switching circuits $SW_{(1)}$~$SW_{(Q)}$ of the switching module 4311 include respective switching transistors $M_{sw(1)}$~$M_{sw(Q)}$. Each of the switching transistors $M_{sw(1)}$~$M_{sw(Q)}$ has a control terminal, an input terminal and an output terminal. The control terminal of the switching transistor is the gate terminal. The input terminal of the switching transistor is electrically connected with the CSL decoding circuit 4313. The output terminal of the switching transistor is electrically connected with the corresponding block.

The switching circuit $SW_{(1)}$ includes the switching transistor $M_{sw(1)}$. The switching circuit $SW_{(Q)}$ includes the switching transistor $M_{sw(Q)}$. The gate terminals of the switching transistors $M_{sw(1)}$~$M_{sw(Q)}$ are electrically connected with the CSL decoding circuit 4313 in order to receive the select signals $DECcsl_{(1)}$~$DECcsl_{(Q)}$. Moreover, according to the voltage levels of the select signals $DECcsl_{(1)}$~$DECcsl_{(Q)}$, the switching transistors $M_{sw(1)}$~$M_{sw(Q)}$ are selectively in an on state or an off state.

The relationships between the blocks and the corresponding signals of the CSL decoder of FIG. 4 are listed in the following Table 1.

TABLE 1

| Block $BLK_{(q)}$ | $DECcs_{(q)}$ | $M_{sw(q)}$ | $CSL_{(q)}$ |
| --- | --- | --- | --- |
| Selected block $BLK_{(k)}$ | VselH | On | Vcsl |
| Unselected block | VselL | Off | Floating |

The first row of Table 1 indicates the relationships between the selected block $BLK_{(k)}$ and corresponding signals of the CSL decoder. For example, the block $BLK_{(1)}$ is the selected block (that is, k=1). The switching circuit $SW_{(1)}$ receives the select signal $DECcsl_{(1)}$ with the first select voltage VselH and the erase voltage Vcsl. Since the first select voltage VselH is higher than the erase voltage Vcsl, the switching transistor $M_{sw(1)}$ of the switching circuit $SW_{(1)}$ is turned on. Under this circumstance, the erase voltage Vcsl is provided to the common source line signal $CSL_{(1)}$. In response to the erase voltage Vcsl, the transistor strings $MS_{(1,1)}$~$MS_{(1,M)}$ of the block $BLK_{(1)}$ undergo the erase operation.

The second row of Table 1 indicates the relationships between the unselected blocks and corresponding signals of the CSL decoder. For example, the block $BLK_{(Q)}$ is one of the unselected blocks. The switching circuit $SW_{(Q)}$ receives the select signal $DECcsl_{(Q)}$ with the second select voltage VselL and the erase voltage Vcsl. Since the second select voltage VselL is lower than the erase voltage Vcsl, the switching transistor $M_{sw(Q)}$ of the switching circuit $SW_{(Q)}$ is turned off. Under this circumstance, the common source line signals corresponding to the unselected blocks are in the floating state. Consequently, the transistor strings of the unselected blocks do not undergo the erase operation.

As mentioned above, the common source line signal corresponding to the selected block is the erase voltage Vcsl, and the common source line signals corresponding to the unselected blocks are in the floating state.

Figure 5:
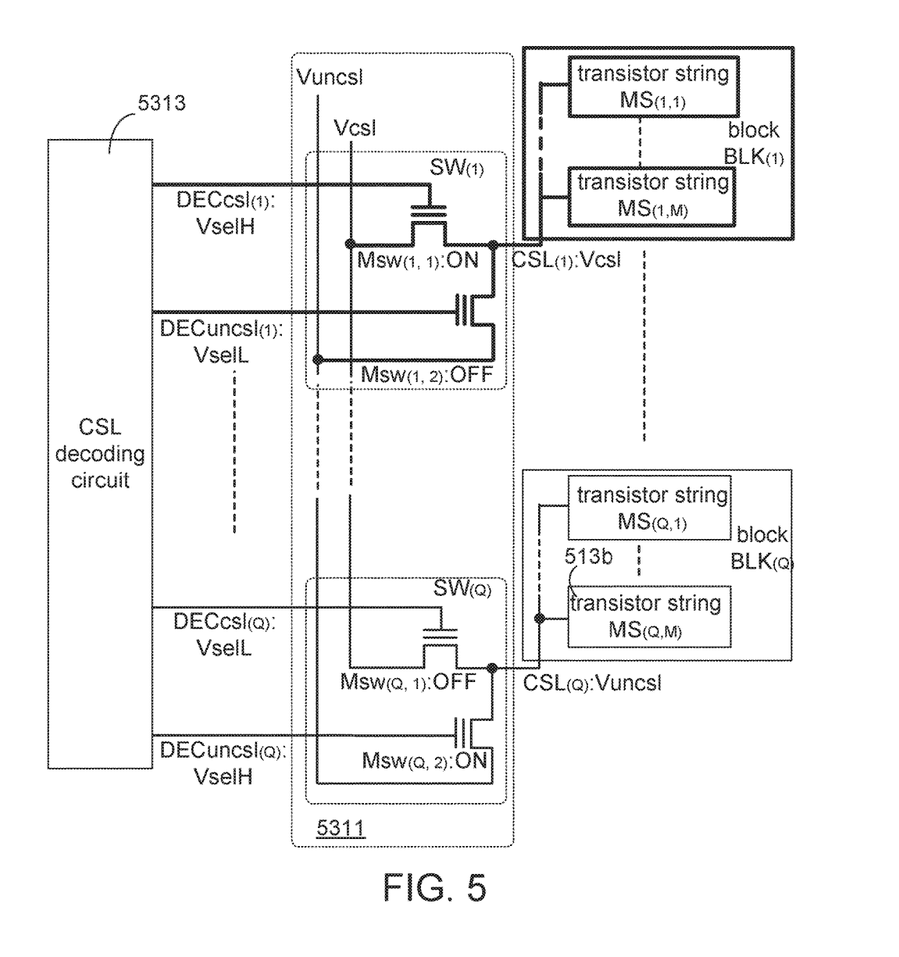
FIG. 5 is another example of a CSL decoder used in the memory device of the present disclosure.

FIG. 5 is another example of a CSL decoder used in the memory device of the present disclosure. As shown in FIG. 5, the CSL decoding circuit 5313 of the CSL decoder issues the select signal $DECcsl_{(1)}$~$DECcsl_{(Q)}$ to the switching module 5311. Each of the switching circuits $SW_{(1)}$~$SW_{(Q)}$ of the switching module 5311 include two switching transistors. Each of the switching circuits $SW_{(1)}$~$SW_{(Q)}$ has a first control terminal, a second control terminal, a first input terminal, a second input terminal and an output terminal. For example, the first control terminal of the switching circuit $SW_{(1)}$ receives the select signal $DECcsl_{(1)}$. The second control signal of the switching circuit $SW_{(1)}$ receives the unselect signal $DECuncsl_{(1)}$. The first input terminal of the switching circuit $SW_{(1)}$ receives the erase voltage Vcsl. The second input terminal of the switching circuit $SW_{(1)}$ receives the un-erase voltage Vuncsl. The output terminal of the switching circuit $SW_{(1)}$ generates the common source line signal $CSL_{(1)}$ to the block $BLK_{(1)}$.

Please refer to FIG. 5 again. The switching circuit $SW_{(1)}$ includes switching transistors $M_{sw(1,1)}$ and $M_{sw(1,2)}$. The switching circuit $SW_{(Q)}$ includes switching transistors $M_{sw(Q,1)}$ and $M_{sw(Q,2)}$. In the switching circuit $SW_{(1)}$, the gate terminal of the switching transistor $M_{sw(1,1)}$ is the first control terminal, and the gate terminal of the switching transistor $M_{sw(1,2)}$ is the second control terminal. Moreover, the source terminal of the switching transistor $M_{sw(1,1)}$ is the first input terminal of the switching circuit $SW_{(1)}$, and the source terminal of the switching transistor $M_{sw(1,2)}$ is the second input terminal of the switching circuit $SW_{(1)}$. Moreover, the drain terminal of the switching transistor $M_{sw(1,1)}$ and the drain terminal of the switching transistor $M_{sw(1,2)}$ are collaboratively used as the output terminal of the switching circuit $SW_{(1)}$. Consequently, the common source line signal $CSL_{(1)}$ from the switching circuit $SW_{(1)}$ is determined according to the on/off states of the switching transistors $M_{sw(1,1)}$ and $M_{sw(1,2)}$.

The relationships between the blocks and the corresponding signals of the CSL decoder of FIG. 5 are listed in the following Table 2.

TABLE 2

| Block $BLK_{(q)}$ | $DECcsl_{(q)}$ | $Msw_{(q,1)}$ | $DECuncsl_{(q)}$ | $Msw_{(q,2)}$ | $CSL_{(q)}$ |
|---|---|---|---|---|---|
| Selected block | VselH | On | VselL | Off | Vcsl |
| Unselected block | VselL | Off | VselH | On | Vuncsl |

The first row of Table 2 indicates the relationships between the selected block $BLK_{(k)}$ and corresponding signals of the CSL decoder. Since the switching transistor $M_{sw(q,1)}$ receives the select signal $DECcsl_{(q)}$ with the first select voltage VselH, and the switching transistor $M_{sw(q,2)}$ receives the unselect signal $DECuncsl_{(q)}$ with the second select voltage VselL, the switching transistor $M_{sw(q,1)}$ is turned on and the switching transistor $M_{sw(q,2)}$ is turned off. Under this circumstance, the erase voltage Vcsl with the high voltage level is provided to the common source line signal $CSL_{(q)}$. In response to the erase voltage Vcsl, the block $BLK_{(q)}$ is erased.

The second row of Table 2 indicates the relationships between the unselected blocks and corresponding signals of the CSL decoder. For example, the block $BLK_{(q)}$ is one of the unselected blocks, where q is not 1. Since the switching transistor $M_{sw(q,1)}$ receives the select signal $DECcsl_{(q)}$ with the second select voltage VselL, and the switching transistor $M_{sw(q,2)}$ receives the unselect signal $DECuncsl_{(q)}$ with the first select voltage VselH, the switching transistor $M_{sw(q,1)}$ is turned off and the switching transistor $M_{sw(q,2)}$ is turned on. Under this circumstance, the un-erase voltage Vuncsl with the low voltage level is provided to the common source line signal $CSL_{(q)}$. In response to the un-erase voltage Vuncsl, the block $BLK_{(q)}$ does not undergo the erase operation.

In this embodiment, the select signal $DECcsl_{(q)}$ and the unselect signal $DECuncsl_{(q)}$ are inversed, and the on/off states of the switching transistors $M_{sw(q,1)}$ and $M_{sw(q,2)}$ are determined according to the select signal $DECcsl_{(q)}$ and the unselect signal $DECuncsl_{(q)}$, respectively. That is, the two switching transistors $M_{sw(q,1)}$ and $M_{sw(q,2)}$ are selectively turned on. Moreover, the switching transistor in the on state generates the common source line signal $CSL_{(q)}$. If the switching transistor $M_{sw(q,1)}$ is turned on, the common source line signal $CSL_{(q)}$ is the erase voltage Vcsl. If the switching transistor $M_{sw(q,2)}$ is turned on, the common source line signal $CSL_{(q)}$ is the un-erase voltage Vuncsl. As mentioned above, the block $BLK_{(k)}$ is the selected block. That is, the switching transistor $M_{sw(q,1)}$ generates the erase voltage Vcsl with the high voltage level. In response to the erase voltage Vcsl, the block $BLK_{(k)}$ is erased. Since the un-erase voltage Vuncsl provided to the unselected blocks are not influenced by the voltage change of the GCSL signal, the GIDL phenomenon and the erase interference can be effectively avoided.

From the above descriptions, the row decoder of the memory device of the present disclosure is equipped with the CSL decoder. The common source line signals generated by the CSL decoder are independent from each other. The common source line signals are provided to all of the blocks. Since the common source line signals provided to the unselected blocks are not influenced by the voltage change of the GCSL signal, the GIDL phenomenon and the erase interference can be effectively avoided.

It is noted that the CSL decoder of the present disclosure can be applied to different types of memory arrays. Some implementations examples will be described as follows.

Figure 6A:
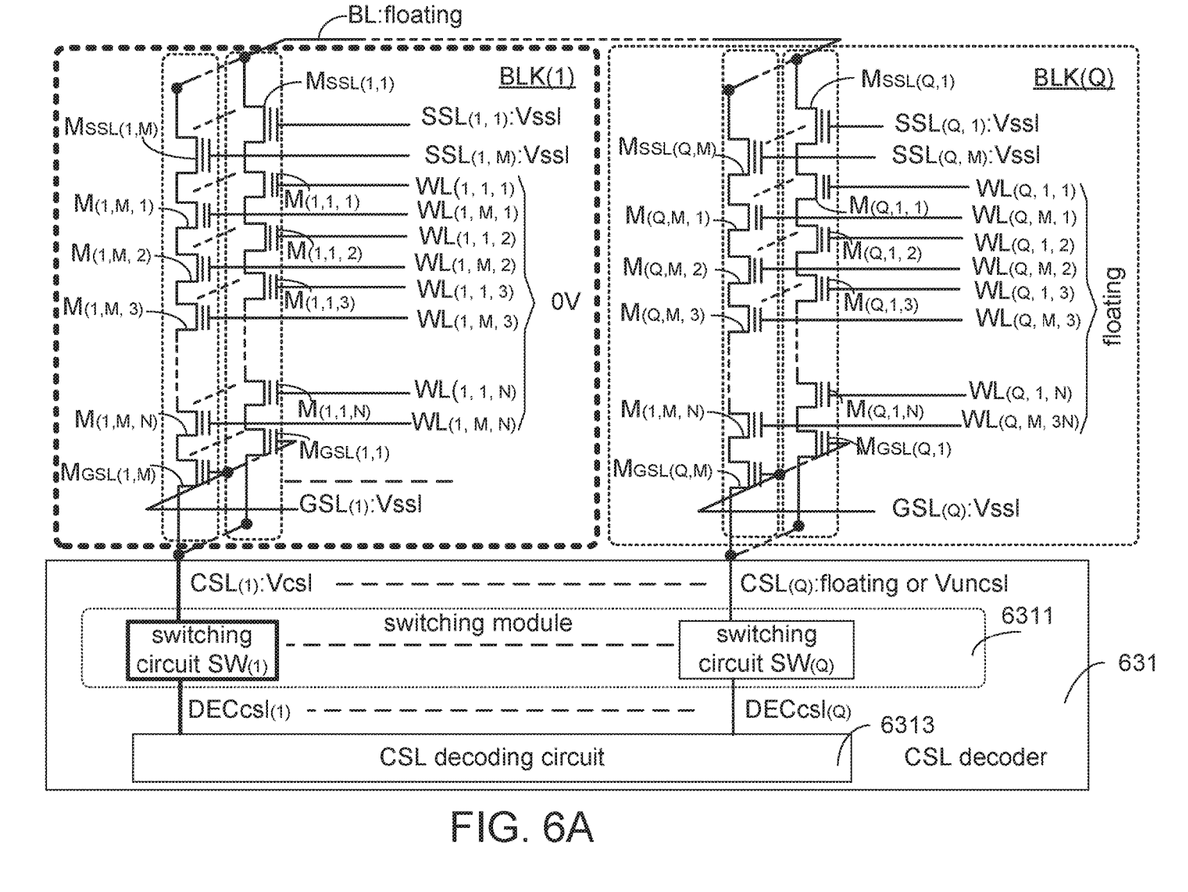
FIG. 6A is a schematic circuit diagram illustrating the application of the CSL decoder to a memory array with the same bit line architecture, in which the SSL signals of the unselected blocks are not in the floating sate.

FIG. 6A is a schematic circuit diagram illustrating the application of the CSL decoder to a memory array with the same bit line architecture, in which the SSL signals of the unselected blocks are not in the floating sate.

As shown in FIG. 6A. The block $BLK_{(1)}$ is the selected block. The string select line signals $SSL_{(1,1)}$~$SSL_{(1,M)}$ outputted from the SSL decoder and provided to the block $BLK_{(1)}$ have a string select voltage Vssl. The word line signals $WL_{(1,1,1)}$~$WL_{(1,M,N)}$ outputted from the WL decoder and provided to the block $BLK_{(1)}$ are all 0V. The voltage level of the ground select signal $GSL_{(1)}$ outputted from the GSL decoder and provided to the block $BLK_{(1)}$ is equal to the string select voltage Vssl.

For example, the block $BLK_{(Q)}$ is one of the unselected blocks. The string select line signals $SSL_{(Q,1)}$~$SSL_{(Q,M)}$ outputted from the SSL decoder and provided to the block $BLK_{(Q)}$ are in a floating state. The word line signals $WL_{(Q,1,1)}$~$WL_{(1,M,N)}$ outputted from the WL decoder and provided to the block $BLK_{(Q)}$ are all in the floating state. The voltage level of the ground select signal $GSL_{(Q)}$ outputted from the GSL decoder and provided to the block $BLK_{(Q)}$ is equal to the string select voltage Vssl. The relationships between the CSL decoding circuit 6313, the switching circuit $SW_{(1)}$, the switching circuit $SW_{(Q)}$, the block $BLK_{(1)}$ and the block $BLK_{(Q)}$ can be further described by referring to the circuitry of FIG. 4 or FIG. 5.

In case that the CSL decoder of FIG. 4 is applied to the memory array of FIG. 6A, the relationships between the blocks and the corresponding signals of the CSL decoder are listed in the following Table 3.

TABLE 3

| Block $BLK_{(q)}$ | $SSL_{(q)}$ | $GSL_{(q)}$ | $CSL_{(q)}$ | $WL_{(q)}$ | $BL_{(q)}$ |
|---|---|---|---|---|---|
| Selected block | Vssl | Vssl | Vcsl | 0 V | Floating |
| Unselected block | Vssl | Vssl | Floating | Floating | Floating |

Please refer to FIG. 6A and Table 3. For example, the block $BLK_{(Q)}$ is one of the unselected blocks. In the ground select line transistors $M_{GSL(Q,1)}$~$M_{GSL(Q,M)}$, the gate terminals receive the string select voltage Vssl, and the source terminals are set as the floating state by the switching circuit SW(Q). Consequently, no leakage current flows from the source terminals of the ground select line transistors $M_{GSL(Q,1)}$~$M_{GSL(Q,M)}$ to the gate terminals.

As shown in FIG. 6A, all of the blocks $BLK_{(1)}$~$BLK_{(Q)}$ are electrically connected with the bit line BL. The string select line signals $SSL_{(1,1)}$~$SSL_{(Q,M)}$ provided to the string select line transistors $M_{SSL(1,1)}$~$M_{SSL(Q,M)}$ of the blocks $BLK_{(1)}$~$BLK_{(Q)}$ have the string select voltage Vssl. The bit line signal $BL_{(q)}$ is in the floating state. Consequently, no leakage current flows from the drain terminals of the string select line transistors $M_{SSL(1,1)}$~$M_{SSL(Q,M)}$ to the gate terminals.

As mentioned above, when the CSL decoder of FIG. 4 is applied to the memory array of FIG. 6A, the ground select line transistors of the unselected blocks or the string select line transistors of all blocks do not generate leakage current. Consequently, the GIDL phenomenon can be effectively avoided.

In case that the CSL decoder of FIG. 5 is applied to the memory array of FIG. 6A, the relationships between the blocks and the corresponding signals of the CSL decoder are listed in the following Table 4.

TABLE 4

| Block $BLK_{(q)}$ | $SSL_{(q)}$ | $GSL_{(q)}$ | $CSL_{(q)}$ | $WL_{(q)}$ | $BL_{(q)}$ |
|---|---|---|---|---|---|
| Selected block | Vssl | Vssl | Vcsl | 0 V | Floating |
| Unselected block | Vssl | Vssl | Vuncsl | Floating | Floating |

Please refer to FIG. 6A and Table 4. For example, the block $BLK_{(Q)}$ is one of the unselected blocks. In the ground select line transistors $M_{GSL(Q,1)}$~$M_{GSL(Q,M)}$, the gate terminals receive the string select voltage Vssl, and the source terminals receive the un-erase voltages Vuncsl. The string select voltage Vssl is higher than the un-erase voltages Vuncsl. Consequently, no leakage current flows from the source terminals of the ground select line transistors $M_{GSL(Q,1)}$~$M_{GSL(Q,M)}$ to the gate terminals. Moreover, The string select line signals $SSL_{(1,1)}$~$SSL_{(Q,M)}$ provided to the string select line transistors $M_{SSL(1,1)}$~$M_{SSL(Q,M)}$ of the blocks $BLK_{(1)}$~$BLK_{(Q)}$ have the string select voltage Vssl. The bit line signal $BL_{(q)}$ is in the floating state. Consequently, no leakage current flows from the drain terminals of the string select line transistors $M_{SSL(1,1)}$~$M_{SSL(Q,M)}$ to the gate terminals.

As mentioned above, when the CSL decoder of FIG. 5 is applied to the memory array of FIG. 6A, the ground select line transistors of the unselected blocks or the string select line transistors of all blocks do not generate leakage current. Consequently, the GIDL phenomenon can be effectively avoided.

Please refer to Table 3 and Table 4 again. Even if the designs of the switching circuits are different, it is not necessary to adjust the string select line signals SSL, the ground select signals GSL, the word line signals WL and the bit line signals BL. The row decoder of the memory device of the present disclosure is equipped with the CSL decoder. The switching circuits of the CSL decoder can be altered according to the practical requirements. As long as the switching circuit is able to distinguish the selected block from the unselected block and the generated voltage level is sufficient to effectively avoid the GIDL phenomenon of the ground select line transistors, the design of the switching circuit is feasible.

Figure 6B:
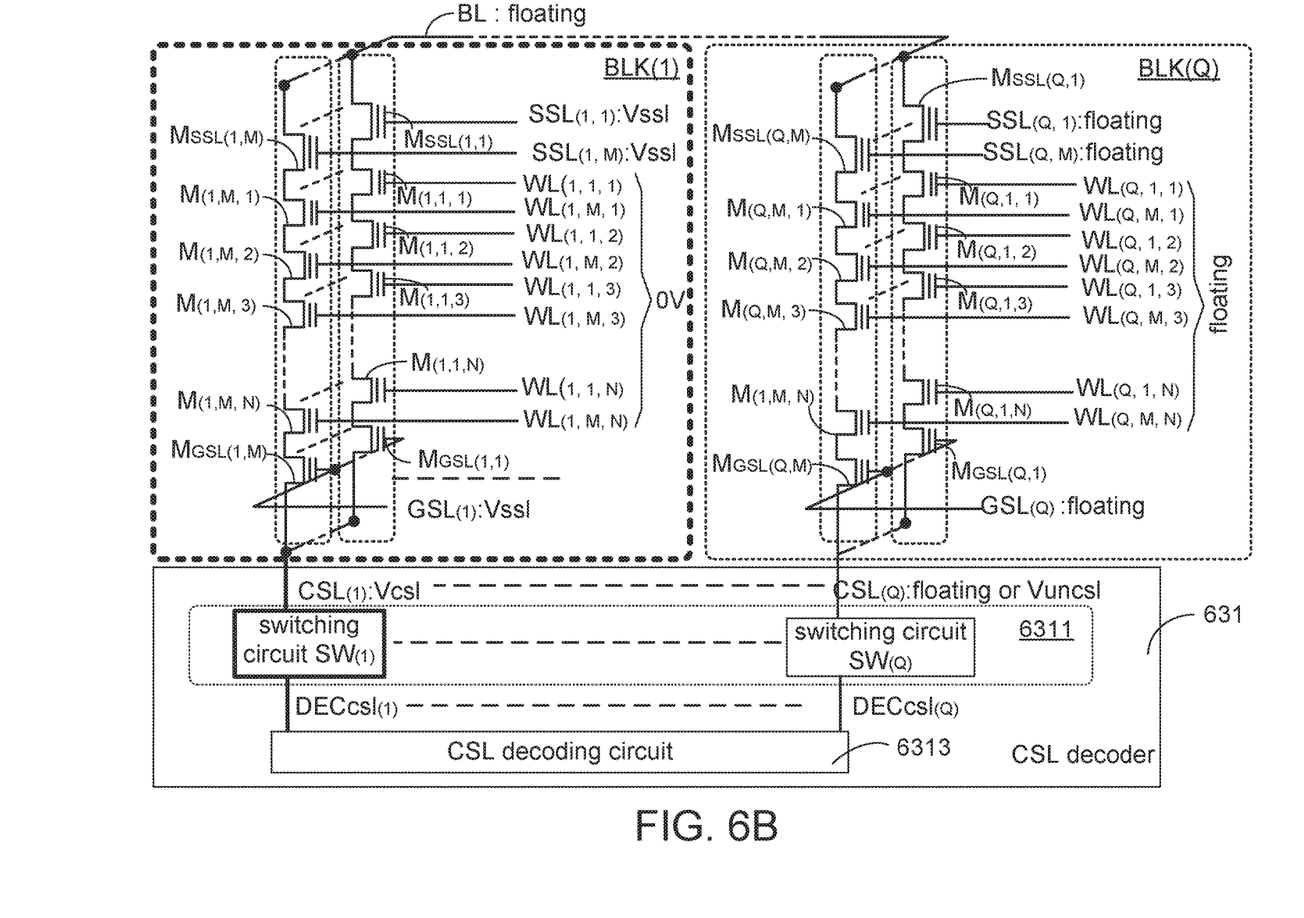
FIG. 6B is a schematic circuit diagram illustrating the application of the CSL decoder to a memory array with the same bit line architecture, in which the SSL signals of the unselected blocks are in the floating sate.

FIG. 6B is a schematic circuit diagram illustrating the application of the CSL decoder to a memory array with the same bit line architecture, in which the SSL signals of the unselected blocks are in the floating sate. In comparison with FIG. 6A, some signals provided to the unselected blocks of the memory array of FIG. 6B are distinguished. For example, the SSL signals from the SSL decoder are in the floating state, and the GSL signals from the GSL decoder are in the floating state.

In case that the CSL decoder of FIG. 4 is applied to the memory array of FIG. 6B, the relationships between the blocks and the corresponding signals of the CSL decoder are listed in the following Table 5.

TABLE 5

| Block $BLK_{(q)}$ | $SSL_{(q)}$ | $GSL_{(q)}$ | $CSL_{(q)}$ | $WL_{(q)}$ | $BL_{(q)}$ |
|---|---|---|---|---|---|
| Selected block | Vssl | Vssl | Vcsl | 0 V | Floating |
| Unselected block | Floating | Floating | Floating | Floating | Floating |

Please refer to FIG. 6B and Table 5. For example, the block $BLK_{(Q)}$ is one of the unselected blocks. In the ground select line transistors $M_{GSL(Q,1)}$~$M_{GSL(Q,M)}$, the gate terminals are in the floating state, and the source terminals are set as the floating state by the switching circuit $SW_{(Q)}$. Consequently, no leakage current flows from the source terminals of the ground select line transistors $M_{GSL(Q,1)}$~$M_{GSL(Q,M)}$ to the gate terminals.

As shown in FIG. 6B, all of the blocks $BLK_{(1)}$~$BLK_{(Q)}$ are electrically connected with the bit line BL. Since the bit line signal $BL_{(q)}$ is in the floating state, the voltage between the drain terminal and the gate terminal of each of the string select line transistors $M_{SSL(1,1)}$~$M_{SSL(Q,M)}$ of the blocks $BLK_{(1)}$~$BLK_{(Q)}$ is not very large. Consequently, no leakage current flows from the drain terminals of the of the string select line transistors $M_{SSL(1,1)}$~$M_{SSL(Q,M)}$ to the gate terminals.

As mentioned above, when the CSL decoder of FIG. 4 is applied to the memory array of FIG. 6B, the ground select line transistors of the unselected blocks or the string select line transistors of all blocks do not generate leakage current. Consequently, the GIDL phenomenon can be effectively avoided.

In case that the CSL decoder of FIG. 5 is applied to the memory array of FIG. 6B, the relationships between the blocks and the corresponding signals of the CSL decoder are similar to those listed in Table 5 except that the common source line signals provided to the unselected blocks have the un-erase voltage Vuncsl.

For example, the block $BLK_{(Q)}$ is one of the unselected blocks. In the ground select line transistors $M_{GSL(Q,1)}$~$M_{GSL(Q,M)}$, the gate terminals are in the floating state, and the source terminals receive the un-erase voltage Vuncsl from the switching circuit $SW_{(Q)}$. Consequently, no leakage current flows from the source terminals of the ground select line transistors $M_{GSL(Q,1)}$~$M_{GSL(Q,M)}$ to the gate terminals. Since the bit line signal $BL_{(q)}$ is in the floating state, the voltage between the drain terminal and the gate terminal of each of the string select line transistors $M_{SSL(1,1)}$~$M_{SSL(Q,M)}$ of the blocks $BLK_{(1)}$~$BLK_{(Q)}$ is not very large. Consequently, no leakage current flows from the drain terminals of the string select line transistors $M_{SSL(1,1)}$~$M_{SSL(Q,M)}$ to the gate terminals. When the CSL decoder of FIG. 5 is applied to the memory array of FIG. 6B, the GIDL phenomenon can be effectively avoided.

For saving the layout area, some kinds of NAND flash memories have one-side architecture. For example, the CSL decoder of the present disclosure can be applied to a memory array of a NAND flash memory with single-gate vertical channel (hereinafter, SGVC) architecture.

Figure 7:
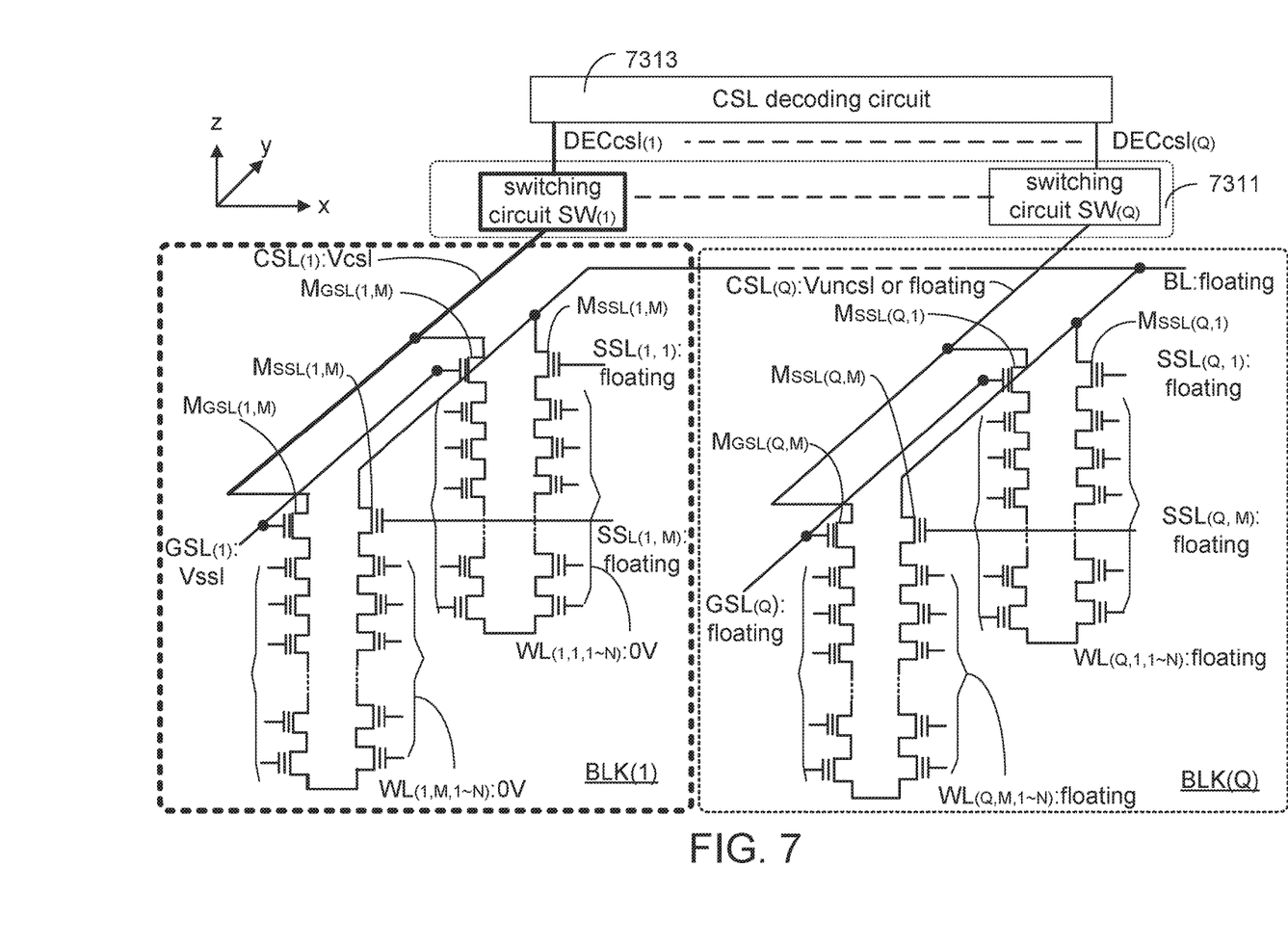
FIG. 7 is a schematic circuit diagram illustrating the application of the CSL decoder to a memory array with the SGVC architecture.

FIG. 7 is a schematic circuit diagram illustrating the application of the CSL decoder to a memory array with the SGVC architecture. As shown in FIG. 7, the transistors of the transistor string are connected with each other in a U-shaped arrangement. That is, the cells in the same transistor string are located at both side of the U-shaped arrangement. The ground select line transistor MGSL and the string select line transistors MSSL in the same transistor string are located at the ends of the both side of the U-shaped arrangement. Moreover, the bit line BL is in the floating state.

The word line signals WL and the ground select signals GSL provided to the selected block $BLK_{(1)}$ and unselected blocks have different voltages. In the selected block $BLK_{(1)}$, the word line signals $WL_{(1,1,1\sim N)}$~$WL_{(1,M,1\sim N)}$ are 0V, and the ground select signal $GSL_{(1)}$ has the string select voltage Vssl. For example, the block $BLK_{(Q)}$ is one of the unselected blocks. In the block $BLK_{(Q)}$, the word line signals $WL_{(Q,1,1\sim N)}\sim WL_{(Q,M,1\sim N)}$ are in the floated state, and the ground select signal $GSL_{(Q)}$ are in the floating state. The string select line signals $SSL_{(1,1)}\sim SSL_{(1,M)}$ provided to the selected block $BLK_{(1)}$ or the string select line signals $SSL_{(Q,1)}\sim SSL_{(Q,M)}$ provided to the unselected block $BLK_{(Q)}$ are in the floating state. The relationships between the CSL decoding circuit 7313, the switching circuit $SW_{(1)}$, the switching circuit $SW_{(Q)}$, the block $BLK_{(1)}$ and the block $BLK_{(Q)}$ can be further described by referring to the circuitry of FIG. 4 or FIG. 5.

In case that the CSL decoder of FIG. 4 is applied to the memory array of FIG. 7, the relationships between the blocks and the corresponding signals of the CSL decoder are listed in the following Table 6.

TABLE 6

| Block $BLK_{(q)}$ | $SSL_{(q)}$ | $GSL_{(q)}$ | $CSL_{(q)}$ | $WL_{(q)}$ | $BL_{(q)}$ |
|---|---|---|---|---|---|
| Selected block | Floating | Vssl | VCSL | 0 V | Floating |
| Unselected block | Floating | Floating | Floating | Floating | Floating |

Please refer to FIG. 7 and Table 6. For example, the block $BLK_{(Q)}$ is one of the unselected blocks. In the ground select line transistors $M_{GSL(Q,1)}\sim M_{GSL(Q,M)}$, the gate terminals are in the floating state, and the source terminals are set as the floating state by the switching circuit $SW_{(Q)}$. Consequently, the voltage between the source terminal and the gate terminal of the ground select line transistor is very small. Consequently, no leakage current flows from the drain terminal of the ground select line transistor to the gate terminal. When the CSL decoder of FIG. 4 is applied to the memory array of FIG. 7, the GIDL phenomenon can be effectively avoided.

In case that the CSL decoder of FIG. 5 is applied to the memory array of FIG. 7, the relationships between the blocks and the corresponding signals of the CSL decoder are similar to those listed in Table 6 except that the common source line signals provided to the unselected blocks have the un-erase voltage Vuncsl.

For example, the block $BLK_{(Q)}$ is one of the unselected blocks. In the ground select line transistors $M_{GSL(Q,1)}\sim M_{GSL(Q,M)}$, the gate terminals In the ground select line transistors $M_{GSL(Q,1)}\sim M_{GSL(Q,M)}$, the gate terminals are in the floating state, and the source terminals receive the un-erase voltage Vuncsl from the switching circuit $SW_{(Q)}$. Consequently, no leakage current flows from the source terminals of the ground select line transistors $M_{GSL(Q,1)}\sim M_{GSL(Q,M)}$ to the gate terminals. In other words, the GIDL phenomenon can be effectively avoided.

In the memory array of FIG. 7, the GIDL phenomenon occurs in only one side of the selected block $BLK_{(k)}$. That is, the GIDL phenomenon occurs in the GSL side of the selected block $BLK_{(k)}$. Consequently, the technology of the present disclosure can effectively avoid the GIDL phenomenon and avoid the erase interference between the unselected blocks.

In the above embodiments of FIGS. 6A, 6B and 7, it is found that different voltages can be applied to the memory device of the present disclosure and the CSL decoder can be applied to the memory array with different structures. In the above embodiments, the NAND flash memories are taken as examples. It is noted that the concepts of the present disclosure can be applied to other memory circuit with the GCSL architecture. For example, the concepts of the present disclosure can be applied to other memories such as 2D NAND flash memories, 3D NAND flash memories, NOR flash memories or one time program (hereinafter, OTP) flash memories.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A memory device performing an erase operation, the memory device comprising:
    a decoding circuit generating Q select signals, wherein a k-th select signal of the Q select signals has a first select voltage, and the other (Q−1) select signals have a second select voltage;
    a switching module electrically connected with the decoder, and receiving an erase voltage, wherein the first select voltage is higher than the erase voltage, and the erase voltage is higher than the second select voltage, wherein the switching module comprises Q switching circuits, and the Q switching circuits receive the erase voltage and generate Q common source line signals according to the Q select signals, wherein a k-th common source line signal of the Q common source line signals generated by a k-th switching circuit of the Q switching circuits has the erase voltage; and
    a memory array electrically connected with the Q switching circuits, wherein the memory array comprises Q blocks, and the Q blocks receive the Q common source line signals, respectively, wherein a k-th block of the Q blocks is erased according to the k-th common source line signal.

2. The memory device as claimed in claim 1, wherein the erase voltage has a high voltage level, and the first select voltage is higher than the second select voltage.

3. The memory device as claimed in claim 1, wherein a q-th switching circuit of the Q switching circuits comprises:
    a first control terminal electrically connected with the decoding circuit, and receiving a q-th select signal of the Q select signals from the decoding circuit;
    a first input terminal receiving the erase voltage; and
    an output terminal electrically connected with a q-th block of the Q blocks, wherein a q-th common source line signal of the Q common source line signals is generated by the q-th switching circuit according to the q-th select signal.

4. The memory device as claimed in claim 3, wherein q, k and Q are positive integers, and q and k are smaller than or equal to Q.

5. The memory device as claimed in claim 3, wherein the q-th switching circuit further comprises a switching transistor, and the switching transistor is electrically connected with the first control terminal, the first input terminal and the output terminal, wherein the switching transistor is selectively turned on according to the q-th select signal.

6. The memory device as claimed in claim 5, wherein
    when the first control terminal receives the first select voltage, the switching transistor of the q-th switching circuit is turned on, and the erase voltage is transmitted to output terminal as the q-th common source line signal, wherein
    when the first control terminal receives the second select voltage, the switching transistor of the q-th switching circuit is turned off, and the q-th common source line signal is in a floating state.

7. The memory device as claimed in claim 3, wherein the decoding circuit further issues Q unselect signals to the Q switching circuits, and the Q switching circuits are further electrically connected with an un-erase voltage, wherein the un-erase voltage is lower than the erase voltage, and the un-erase voltage is lower than the first select voltage, wherein a k-th unselect signal of the Q unselect signals has the second select voltage, and the other (Q−1) unselect signal has the first select voltage.

8. The memory device as claimed in claim 7, wherein
if q is equal to k, the erase voltage is outputted from the q-th switching circuit as the q-th common source line signal, wherein
if q is not equal to k, the un-erase voltage is outputted from the q-th switching circuit as the q-th common source line signal.

9. The memory device as claimed in claim 7, wherein the q-th switching circuit further comprises:
a second control terminal electrically connected with the decoding circuit, and receiving a q-th unselect signal of the Q unselect signals from the decoding circuit; and
a second input terminal receiving the un-erase voltage.

10. The memory device as claimed in claim 9, wherein the q-th switching circuit further comprises:
a first switching transistor electrically connected with the first control terminal, the first input terminal and the output terminal, and selectively turned on according to the q-th select signal; and
a second switching transistor electrically connected with the second control terminal, the second input terminal and the output terminal, wherein the second switching transistor is selectively turned on according to the q-th unselect signal.

11. The memory device as claimed in claim 10, wherein if q is equal to k,
the q-th select signal has the first select voltage, the first switching transistor of the q-th switching circuit is turned on,
the q-th unselect signal has the second select voltage, and the second switching transistor of the q-th switching circuit is turned off,
wherein the erase voltage is outputted from the first switching transistor as the q-th common source line signal, and the q-th block is erased.

12. The memory device as claimed in claim 10, wherein if q is not equal to k,
the q-th select signal has the second select voltage, the first switching transistor of the q-th switching circuit is turned off,
the q-th unselect signal has the first select voltage, and the second switching transistor of the q-th switching circuit is turned on,
wherein the un-erase voltage is outputted from the second switching transistor as the q-th common source line signal, and the q-th block is not erased.

13. The memory device as claimed in claim 3, wherein each of the Q blocks comprises M transistor strings, and each of the M transistor strings comprises a first select transistor, a second select transistor and N cells, wherein the N cells are electrically connected between the first select transistor and the second select transistor.

14. The memory device as claimed in claim 13, wherein the M transistor strings of the q-th block receive the same bit line signal.

15. The memory device as claimed in claim 14, wherein the bit line signal is in a floating state.

16. The memory device as claimed in claim 13, wherein the second select transistors of the M transistor strings of the q-th block are electrically connected with the q-th switching circuit for receiving the q-th common source line signal from the q-th switching circuit.

17. A control method for erasing a memory device, the memory device comprising a decoding circuit, Q switching circuits and Q blocks, the control method comprising steps of:
generating Q select signals by the decoding circuit, wherein a k-th select signal of the Q select signals has a first select voltage, and the other (Q−1) select signals have a second select voltage;
receiving an erase voltage by the Q switching circuits, wherein the first select voltage is higher than the erase voltage, and the erase voltage is higher than the second select voltage;
generating Q common source line signals by the Q switching circuits according to the Q select signals, wherein a k-th common source line signal of the Q common source line signals generated by a k-th switching circuit of the Q switching circuits has the erase voltage;
receiving the Q common source line signals by the Q blocks; and
erasing a k-th block of the Q blocks according to the k-th common source line signal.

18. The control method as claimed in claim 17, wherein a q-th switching circuit of the Q switching circuits receives a q-th select signal of the Q select signals from the decoding circuit, and a q-th common source line signal of the Q common source line signals is generated by the q-th switching circuit according to the q-th select signal.

19. The control method as claimed in claim 18, wherein
if q is equal to k, the q-th select signal has the first select voltage, wherein
the erase voltage is outputted from the q-th switching circuit as the q-th common source line signal, and a q-th block of the Q blocks is erased.

20. The control method as claimed in claim 18, wherein
if q is not equal to k, the q-th select signal has the second select voltage, wherein
the q-th common source line signal is set to be in a floating state by the q-th switching circuit, or
an un-erase voltage is outputted from the q-th switching circuit as the q-th common source line signal,
wherein a q-th block of the Q blocks is not erased.

* * * * *